United States Patent [19]

Bennett

[11] Patent Number: 4,896,254
[45] Date of Patent: Jan. 23, 1990

[54] PROTECTIVE POWER CONTROLLER

[75] Inventor: Robert M. Bennett, Canton, Mich.;
Brian J. Cherek, Cascade, Colo.;
Harsha M. Dabholkar, Mundelein,
Ill.

[73] Assignee: Honeywell Inc., Minneapolis, Minn.

[21] Appl. No.: 345,143

[22] Filed: Apr. 28, 1989

[51] Int. Cl.$^4$ .............................................. H02H 7/10
[52] U.S. Cl. ......................................... 363/50; 363/79;
323/267; 340/588; 340/664; 307/18; 307/39;
307/82; 307/86; 361/87; 361/94; 361/103
[58] Field of Search .................... 363/50, 65, 78, 79;
323/267, 313, 315, 316, 907; 307/18, 24, 29, 38,
39, 82, 85, 86; 361/87, 93, 94, 103; 340/584,
588, 657, 664

[56] References Cited

U.S. PATENT DOCUMENTS

| | | | |
|---|---|---|---|
| 3,538,405 | 11/1970 | Borden et al. | 307/82 |
| 3,609,504 | 9/1971 | Barker et al. | 320/7 |
| 3,703,679 | 11/1972 | Heidt | 323/9 |
| 3,729,671 | 4/1973 | Jeffery et al. | 363/50 |
| 3,987,342 | 10/1976 | Bird et al. | 317/41 |
| 4,270,165 | 5/1981 | Carpenter et al. | 363/65 |
| 4,288,831 | 9/1981 | Dolikian | 363/50 |
| 4,309,748 | 1/1982 | Forró et al. | 363/79 |
| 4,310,770 | 1/1982 | Keener et al. | 307/39 |
| 4,329,600 | 5/1982 | Stewart | 307/540 |
| 4,331,999 | 5/1982 | Engel et al. | 361/94 |
| 4,342,065 | 7/1982 | Larson | 361/93 |
| 4,481,553 | 11/1984 | Owen et al. | 361/93 |
| 4,498,022 | 2/1985 | Koyama et al. | 307/473 |
| 4,525,765 | 6/1985 | Brajder | 361/88 |
| 4,622,511 | 11/1986 | Moore | 323/267 |
| 4,628,397 | 12/1986 | Gareis et al. | 361/103 |
| 4,635,178 | 1/1987 | Greenhalgh | 307/82 |
| 4,796,142 | 1/1989 | Libert | 361/94 |

Primary Examiner—Peter S. Wong
Attorney, Agent, or Firm—Kinney & Lange

[57] ABSTRACT

A power controller system for providing electrical power to a multiplicity of loads at outputs thereof under direction of a plurality of input controllers operating a corresponding plurality of output energization means with the controllers capable of having different output states in response to differnt system input signals, the controller having selected common components for forcing selected ones of said input controllers to terminate power to corresponding loads. Current sensing means upsetting current balances in bipolar transistors are used to sense beyond-limit currents.

26 Claims, 5 Drawing Sheets

PROTECTIVE POWER CONTROLLER

BACKGROUND OF THE INVENTION

The present invention relates to protective power controllers for operating electrical and electronic circuitry and, more particularly, to protective power controllers for multiple loads.

Supplying electrical power to loads has long been recognized as requiring some protective means associated therewith to protect the power supply arrangement in case of malfunctions in the load leading to unexpectedly large power dissipation therein. A number of different kinds of protective means have been used including fuses, circuit breakers or other circuit arrangements which disrupt the supply of power to the load because of same malfunction therein.

Electronic power controllers with protective means provided therein are attractive for use with loads which are to be supplied power under the control of other devices such as computers. Such electronic power controllers can be operated through input signals provided thereto to control the supplying of power to the load or loads and the cessation of same very conveniently.

Further, electronic power controllers can very rapidly detect conditions indicating a malfunction in a load, and so very quickly shut off further supply of power to that malfunctioning load. Better yet, electronic power controllers can be configured to periodically review the situation at the load to determine if the malfunction condition has ended and, if so, to then again permit power to be applied to that load. Thus, if the duration of the period between such reviews is sufficiently short, little time need be lost between the disappearance of a malfunction condition and the resupply of power to the load.

The period of such load malfunction reviews in an electronic power controller is typically set by a timer which keeps power from the load for the duration of the selected timer timing period. Thereafter, power is again supplied to the load and sensing determines whether the malfunction continues to exist. If so, the timer is again initiated and power is removed from the load until the end of the succeeding timer timing period. This cyclic reviewing continues until the malfunction ends, after which power can again be continuously supplied to the load.

This mode of operation provides some difficulties if an electronic power controller is used with several outputs to operate several loads. Use of such a timer to control the circuits for each output leads to having the timer, if initiated by one malfunctioning load, terminate the supply of power to all of these loads from the corresponding output circuits, even those output circuits which do not have malfunctioning loads connected to them. On the other hand, the use of an individual timer circuit for each output control circuit adds considerably to the amount of circuitry which must be provided in the multiple output electronic power controller. Yet, at the same time in this situation, the use of a temperature sensing means to sense the temperature reached by the electronic power controller structure in supplying power to the multiple loads usually demands that the sensing means be able to terminate the supply of power from all of the output circuits in the controller. Also, once such output circuits are directed to cease the supply of electrical power to the power controller outputs, such outputs should be prevented from supplying current to the loads connected thereto no matter where the other sides of those loads are additionally connected, which can vary if the controller is to be able to both selectively provide current to and from such loads. Thus, there is desired an electronic power controller having multiple outputs having the capabilities needed to avoid the difficulties just mentioned.

SUMMARY OF THE INVENTION

The present invention provides a power controller system for providing electrical power to a multiplicity of loads at outputs thereof, the controller having therein a plurality of input controllers, one for each output, operating a corresponding plurality of output energization means where such an input controller connected to such energization means can have different output states in response to different system input signals directing that the system outputs provide or remove current, or alternatively, be in a high impedance state. A corresponding plurality of current sensing means senses any currents flowing through the energization means with values beyond selected limits to together operate a corresponding plurality of resettable memory means and a power removal timer through a coupling means coupling signals from these current sensing to that power removal timer and those memory means. The power removal timer also operates each of the resettable memory means which together, through a further coupling means, operate the input controllers to override the input signals thereto if unacceptable currents have been sensed by the sensing means corresponding to that controller.

A plurality of delay timers can be used with each inserted between a corresponding current sensing means and both the corresponding resettable memory means and the power removal timer to reduce the effects of transients in the load. A temperature sensing means sensing whether temperatures in the power controller structure have exceeded selected limits is connected to be capable of overriding input signals in the input controllers to thereby terminate the power being supplied to loads connected to the system outputs.

The current sensing means upsetting current balances in bipolar transistors are used to sense beyond-limit currents.

DETAILED DESCRIPTION OF THE PREFERRED EMBODIMENTS

Figure 1:
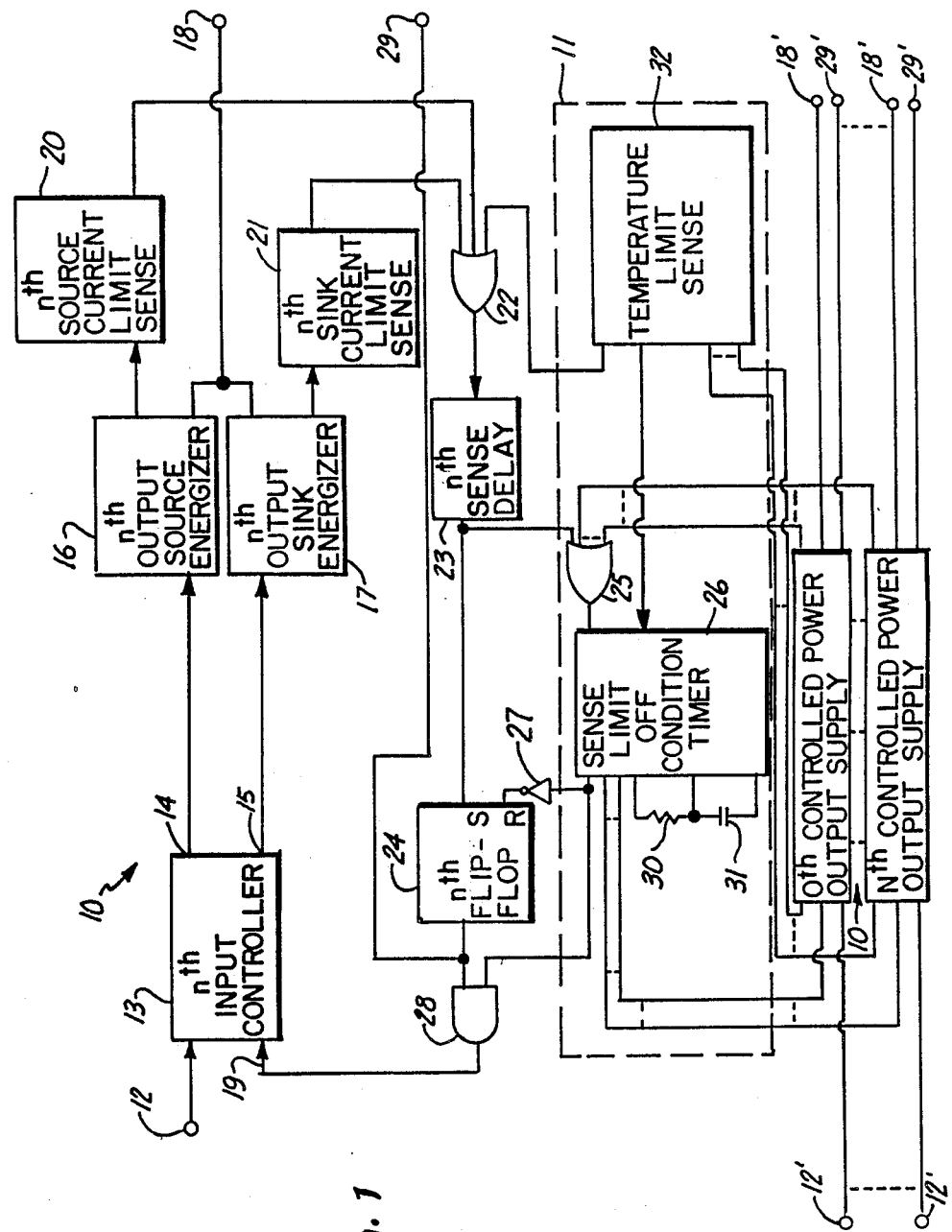
FIG. 1 is a mixed system block, circuit schematic and logic gate diagram embodying the present invention.

FIG. 1 shows a block diagram, using some logic gates and circuit symbols also, of a multiple output power controller system. This power controller system has N controlled output supplies, 10, as portions thereof beginning with a zeroth controlled power output supply continuing through to the $N^{th}$ controlled power supply. All controlled output power supplies 10 are shown as single blocks at the bottom of FIG. 1, except for the $n^{th}$ power supply among them which is shown in greater detail from the middle toward the top of that FIG. Each of controlled power output supplies 10 shown below dashed line box 11 in FIG. 1 can be represented by a block diagram portion identical to that shown above dashed line box 11 in FIG. 1.

In addition, there is shown between the $n^{th}$ one of controlled output power supplies 10 and the remaining ones thereof, and enclosed within a dashed line box, 11, components which are provided only once in the power controller system. These components, however, are electrically connected to all of controlled power output supplies 10.

Considering the $n^{th}$ one of controlled power output supplies 10 shown above dashed line box 11, an input terminal, 12, is provided for $n^{th}$ supply 10 which is electrically connected to an $n^{th}$ input controller, 13, therefor. Note that similar inputs, 12', are provided for the other ones of controlled power supplies 10. Input controller 13 has a pair of outputs, 14 and 15. The $n^{th}$ one of controlled power supplies 10 can be commanded to provide a current flowing into a load connected to its output at a selected positive voltage through having a high voltage level, representing a logic value "1", provided at input 12 if the source of this logic value voltage level can provide an adequate current in this logic state at input terminal 12. The current supply capability requirement for such a source is typically greater in value than 20 $\mu$A. This also places output 14 of input controller 13 in a state in which it will draw a current.

Alternatively, placing input terminal 12 in a low voltage level state, representing a logic value "0", again with the source thereof having the ability to supply a current of a value typically greater than 20 $\mu$A at that terminal, causes the $n^{th}$ one of controlled power output supplies 10, at its output, to draw current through a load connected to that output placed at a selected voltage. This is given effect through this command also causing output 15 of input controller 13 to alternatively be in a state in which it draws current rather than output 14.

A final control alternative at input 12 of input controller 13 is to connect terminal 12 to a high impedance so that less than a selected current amount, again typically 20 $\Omega$A, is permitted to flow either from or to that terminal. In this instance, neither of outputs 14 and 15 of input controller 13 will draw current and, as a result, the $n^{th}$ one of controlled power output supplies 10 will also exhibit a high impedance at its output thereby preventing any significant current flow through a load connected to that output.

The various current flow states at outputs 14 and 15 of input controller 13 cause these effects at the output of the $n^{th}$ one of controlled output power supplies 10 through these outputs being connected to the inputs of the $n^{th}$ output source energizer, 16, and the $n^{th}$ output sink energizer, 17, respectively. The outputs of energizers 16 and 17 are joined together to form a supply output, 18, for the $n^{th}$ one of controlled power supplies 10. A current drawn at output 14 of input controller 13 causes output source energizer 16 to connect supply output 18 to a positive voltage very near the voltage value of the voltage supply selected to supply system load power. A current drawn at output 15 of input controller 13 causes output sink energizer 17 to connect supply output 18 to a value near the low value reference voltage used with the output power supply, typically ground.

The current drawn through one or the other of energizers 16 and 17 is measured in a corresponding current sense arrangement to determine the occurrence of any output current through the appropriate energizer beyond selected limits as a basis for terminating the supply of power at supply output terminal 18 for such excessive currents. This is accomplished by causing the current sense arrangement to provide a signal to a further input, 19, of the $n^{th}$ input controller 13 which causes any current being drawn at either of outputs 14 and 15 of input controller 13 to cease.

Such a cessation at the outputs of input controller 13 leads to directing energizers 16 and 17 to provide a high impedance at the outputs thereof connected to supply output 18. This high impedance prevents any current flow through a load connected to supply output 18, and does so no matter to what the other side of the load connected to supply output 18 is connected if is within the range of voltage permitted for the output power supply providing electrical power to supply output 18 through either of energizers 16 or 17.

The occurrence of such a current sense arrangement signal at input 19 of input controller 13 comes about through using a $n^{th}$ source current limit sensor, 20, to determine if load currents flowing through energizer 16 exceed a selected limit, and a $n^{th}$ sink current sensor, 21, to determine if load currents flowing through sink energizer 17 exceed a selected limit. Should any current flow in either of energizers 16 or 17 beyond the selected limit therefor, a logic signal will be present at the output of the corresponding one of current limit sensors 20 and 21 indicating this beyond-limit current flow condition. The outputs of each are connected to an input of an OR logic gate, 22, which will thus receive such a logic signal. That signal, provided at the output of either of current limit sensors 20 or 21, will cause a change in the output logic state of OR logic gate 22 which is transmitted to an $n^{th}$ sense delay circuit, 23.

Sense delay circuit 23 provides a delay before a logic state change appears at its output in response to the appearance of a logic state change at its input due to such a state change at the output of gate 22. This delay eliminates passing on the effects of current transients occurring in energizers 16 and 17 which could otherwise cause input controller 13 to switch off these energizers, but only if the transient is of a sufficiently short duration set by the delay selected to be provided by delay circuit 23. This capability is provided by delay circuit 23 because circuit 23 has the characteristic of preventing any logic level change at its output unless a logic signal change at its input lasts for the full duration of the delay provided in that delay circuit.

Any occurrence of a logic state change at the output of $n^{th}$ sense delay 23 is applied to the S input of an R-S flip-flop, 24, to which the output of delay circuit 23 is connected. Flip-flop 24 correspondingly sets its output in a high voltage value logic state. Also placed in a high voltage value logic state is the output of a further OR logic gate, 25, to an input of which the output of $n^{th}$ sense delay circuit 23 is also connected. This arrangement provides for a periodic review of any beyond-limit current flow condition in either of energizers 16 or 17 so that they can be permitted to pass current again shortly after the cause of any beyond-limit current is removed.

Thus, a high logic state at the output of OR logic gate 25 initiates activity in a sense limit off condition timer, 26, first switching its outputs to a high voltage level logic state from the low voltage level logic state they were in when the timer was quiescent. This logic state is converted to a low voltage level logic state by an inverter, 27, and applied to the reset or R input of R-S flip-flop 24, leaving its output in a high voltage level logic state. Thus, an AND logic gate, 28, having an input thereof connected to the output of flip-flop 24 and another input thereof connected to the output of sense limit off condition timer 26, has its output placed in a high voltage level logic state which is applied to input 19 of $n^{th}$ input controller 13. This high logic state, applied to input 19 of input controller 13, causes a high impedance state to occur at both of the outputs 14 and 15 of input controller 13 which, as described above, causes the outputs of energizers 16 and 17 to also be in a high impedance state. Energizers 16 and 17 having the outputs thereof in high impedance states prevents any currents through a load connected to output terminal 18 of the $n^{th}$ one of controlled power output supplies 10.

This cessation of current flow at terminal 18 eliminates the beyond-limit current flow condition sensed by either sensors 20 or 21, and therefore the beyond-limit signal at the output of these sensors which, without any memory thereof, would lead to an immediate resupply of current at terminal 18 leading to the whole system oscillating "on" and "off" rather rapidly. Flip-flop 24 effectively remembers this beyond-limit condition has occurred and keeps a high logic state at its output until timer 26 completes its selected timing duration permitting its output to return to a low logic state. This current flow prevention mode of operation due to a beyond-limit current condition in either of energizers 16 or 17 is indicated by a high voltage level logic state on an indicator output, 29, connected to the output of flip-flop 24, which continues so long as the memory of its occurrence is maintained in flip-flop 24.

Thus, this situation of high impedances at the outputs of energizers 16 and 17, and so output 18, continues so long as a high logic state appears at the output of timer 26, a logic state which endures for a selected time without regard to further signal inputs to that timer, this selected time duration being set by the values being chosen for a resistor, 30, and a capacitor, 31, connected to terminals of that timer. At the end of such a time duration, a low voltage value logic state appears at the output of sense limit-off condition timer 26 which is supplied to AND gate 28 causing a low voltage value state to occur at its output to thereby permit input controller 13 to have the states of its outputs 14 and 15 again be controlled by commands at system input terminal 12. The low voltage value logic state at the output of timer 26 also leads to a high voltage value logic state occurring at the output of inverter 27 which, being applied to the reset or R input of R-S flip-flop 24, caused the output of that flip-flop to go to a low voltage value logic state. This result also is consistent with directing AND logic gate 28 to have its output in a low voltage value logic state.

If then the signals at system input 12 are directing that one of energizers 16 or 17 permit current flow through a load connected to output terminal 18, that current flow will begin, or resume if that had been the command at system input 12 at the initial sensing of a beyond-limit condition by either sensors 20 or 21. Should the beyond-limit current flow condition persist in either of energizers 16 or 17, the appropriate one of sensors 20 or 21 will again sense that condition and the sequence described above will repeat with the result that a high voltage value logic state will again appear at input 19 of $n^{th}$ input controller 13 causing energizers 16 and 17 to again go into a high impedance state. This sequence will repeat so long as the same command remains at input 12 and the condition leading to beyond-limit current flowing in either energizers 16 or 17 continues. Upon this beyond-limit current flow condition being eliminated, energizers 16 and 17 will again operate solely under the control of input command signals appearing at system input 12.

A further protective arrangement is provided in the power controller system of FIG. 1 through the use of a temperature limit sensor, 32, which senses the temperature occurring in the monolithic integrated circuit chip in which this system is provided. One sensing method is to operate semiconductor pn junctions formed in the chip as diodes which will have the voltage across each being of a value reflecting the temperature of that junction. Temperatures beyond a selected limit cause voltages thereacross that can be sensed by a differential amplifier and lead to sensor 32 providing an output signal at outputs thereof that are supplied to an input of OR logic gate 22 and an input of sense limit off condition timer 26.

These signals to the inputs of gate 22 and timer 26 keep the outputs thereof in a high voltage level logic state to thereby cause a high voltage level logic state at the output of AND logic gate 28. This high logic state is supplied to input 19 of $n^{th}$ input controller 13 to cause its outputs to be in a high impedance state. Again, this input controller high impedance state, as described above, causes the outputs of energizers 16 and 17 to also be in a high impedance state preventing any current flow through a load connected to output 18 of the $n^{th}$ one of controlled power output supplies 10.

Similar signals at other outputs of temperature limit sensor 32 are applied to the identical components in the others of controlled power output supplies 10 to have a similar effect on their outputs, 18'. Since all of controlled power output supplies 10 are intended to be formed in a common monolithic integrated circuit, any or many of them cumulatively, or all of them cumulatively, could contribute to a temperature increase rising unacceptably beyond the selected limit and so all of the outputs 29 and 29' thereof are switched into a high impedance state in this condition.

The circuits of controlled power output supplies 10 other than the $n^{th}$ one shown in greater detail here are configured and operated in the same manner as is the $n^{th}$ one described above. They can all share OR logic gate 25 and sense limit off condition timer 26 because each of them has a corresponding AND gate 28 used therein requiring a locally sensed beyond-limit current condition in one of the energizers therein in addition to a high logic state at the output of timer 26 to force its input controller into a high impedance state. Thus, although OR logic gate 25 can have its output switched into a high logic state by any of the sense delay circuits in any of controlled power output supplies 10 to result in a high logic state occurring at the output of timer 26, only those of supplies 10 which have a beyond-limit current sensed therein will be subject to having its input controller forced into a high impedance state at its outputs. Thereby, the outputs of just the energizers therein will also be forced into a high impedance state.

Figure 2:
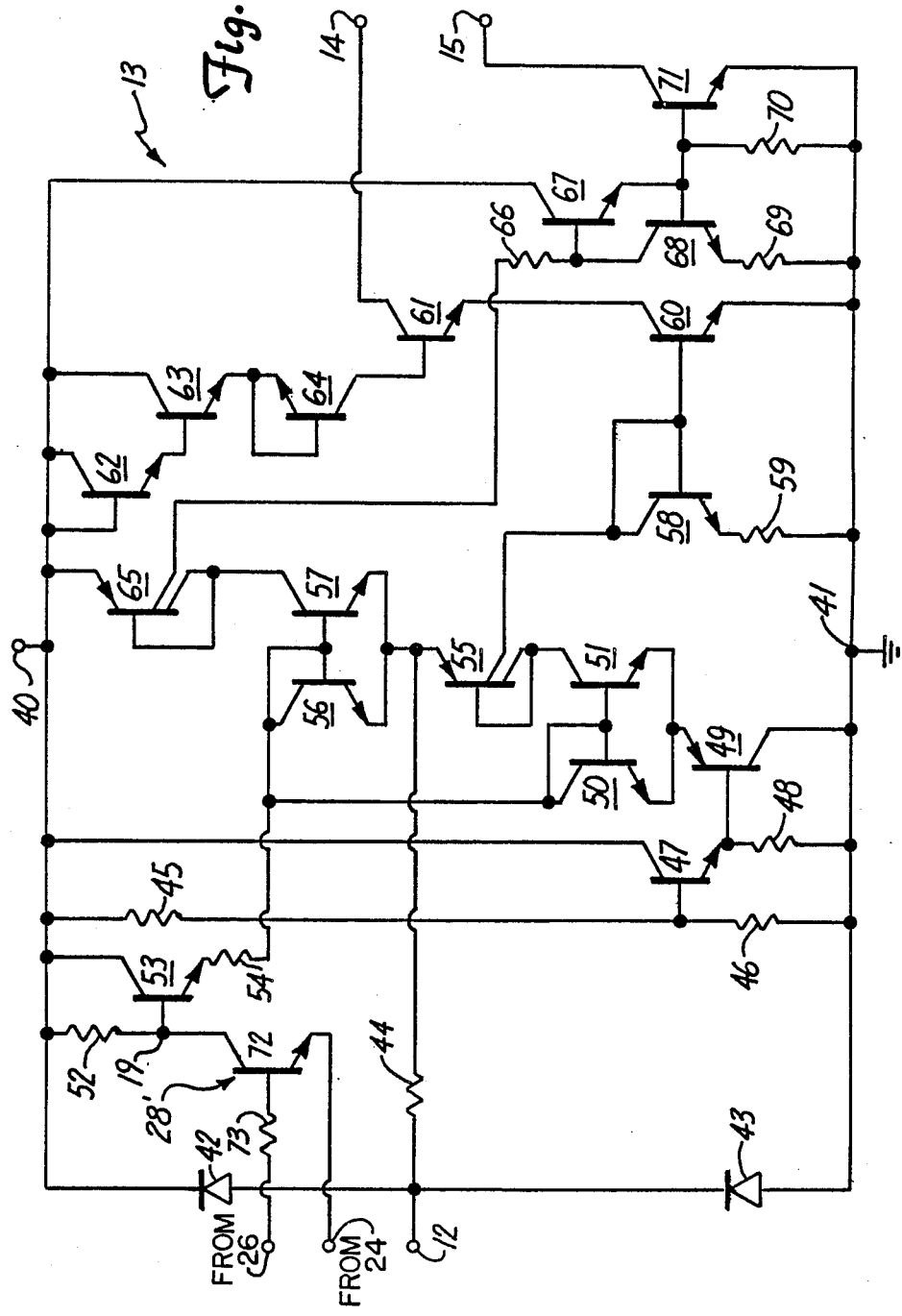
FIG. 2 is a circuit schematic diagram of a portion of FIG. 1.

FIG. 2 shows a schematic diagram of a circuit which can serve as input controller 13 for any of controlled power output supplies 10 of FIG. 1, and which incorporates within it a portion which can serve as part of AND logic gate 28. Thus, terminals in FIG. 2 matching those for input controller 13 of FIG. 1 are designated by the same numerals in FIG. 2 as they are in FIG. 1. The other two input terminals to the left in FIG. 2 represent an input of AND logic gate 28 and an input from a remaining portion of that gate connected to the other input thereof.

The circuit of FIG. 2 has a positive input voltage terminal, 40, where a positive voltage is to be supplied with respect to a ground reference terminal, 41. The positive voltage which is intended to be supplied at terminal 40 is a regulated voltage of a typical value of around 5.0 V.

The circuit of FIG. 2 has a couple of pairs of current mirrors biased such that the logic state voltage level on input terminal 12, if supplied from a sufficiently low impedance source, selects current to flow through one or the other. A high impedance state at terminal 12, preventing any significant current flow therethrough, leads to so little current flowing in either of these mirror pair halves as to prevent significant current being drawn at either of outputs 14 or 15. Note that input terminal 12 is protected by a pair of diodes, 42 and 43, which limit voltage excursions permitted in the circuit of FIG. 2 should voltage values inadvertently be applied at terminal 12 which are greater than a little more than 5.0 V or a little less than 0.0 V.

Assume first that terminal 12 has connected to it a high impedance, that is, connected to a logic signal source that is in a high impedance state so that very little current can flow therethrough or through a series resistor, 44, connected thereto. In that instance, the circuit of FIG. 2 can be considered with resistor 44 essentially removed therefrom. A voltage setting arrangement is provided by a pair of resistors, 45 and 46, connected in a voltage divider arrangement between terminals 40 and 41. This arrangement permits approximately 1.1 V to 1.2 V to appear at the circuit node therebetween which is connected to the base of a npn bipolar transistor, 47. A further resistor, 48, in the emitter circuit of transistor 47, is thus constrained to have a voltage thereacross equal to the voltage at the junction of resistors 45 and 46 less the base-emitter voltage of transistor 47, or approximately 0.5 V. The collector of transistor 47 is connected to positive voltage terminal 40, and the other side of resistor 48 is connected to ground reference terminal 41.

This last voltage across resistor 48 is applied to the base of a pnp bipolar transistor, 49, to maintain that base at approximately 0.5 V. The collector of transistor 49 is connected to ground reference terminal 41, and the emitter thereof is connected to a current mirror circuit comprising a pair of npn bipolar transistors, 50 and 51, having their emitters directly connected to one another and having their bases directly connected to one another. The base of transistor 50 is also directly connected to the collector of transistor 50 to, in effect, convert it into a diode using its base-emitter junction therefor.

A source of bias current is supplied through a resistor, 52, connected to the base of an npn bipolar transistor, 53, which in turn has a resistor in its emitter circuit, 54, connected between the emitter of transistor 53 and the collector and base of transistor 50. The collector of transistor 53 is connected to positive voltage terminal 40. In the circuit path from terminal 40 through resistor 52, transistor 53, resistor 54, transistor 50, transistor 49 and resistor 48, there are three base-emitter voltage drops in addition to the bias voltage across resistor 48. The difference between these voltages and the voltage on terminal 40 is dropped across resistors in this path which are chosen to have values so that just a few microamps at most can flow in this circuit. This also means, because of the current mirror nature of transistors 50 and 51, that transistor 51 draws only a few microamps at its collector from resistor 54 through the two current mirrors in series therewith.

The first of these two current sources is formed by a two collector pnp bipolar transistor, 55, having its base and one of its collectors both connected to the collector of transistor 51. The emitter of transistor 55 is connected to a further current mirror formed by a pair of npn bipolar transistors, 56 and 57, having the emitters of each directly connected to one another and the bases of each directly connected to one another. The base of transistor 56 is shorted to its emitter and both are connected to the collector of transistor 50 and one end of resistor 54 so that in effect the diode formed by transistor 50 is in parallel with the series connected diodes formed by transistors 56 and 55, in series with transistor 51.

Thus, transistor 51 will be in saturation trying to draw current through the two diode voltage drop of transistors 55 and 56 as loads supplied with a voltage thereacross of only the one diode voltage drop of transistor 50. Hence, a minuscule current at most will flow in the other collector of transistor 55, much less than the few microamps flowing in transistor 50, and this will be supplied to the collector of a further npn bipolar transistor 58, and to its base circuit shared with another bipolar transistor base. The emitter of transistor 58 is connected through a further resistor, 59, to ground reference terminal 41.

Transistor 58 is part of an output current mirror circuit having its base circuit shared with that of another npn bipolar transistor, 60, by being directly connected thereto with transistor 60 having its emitter connected to ground reference terminal 41. Thus, the extremely small current, if any, supplied by the second collector of transistor 55 is split between the collector of transistor 58 and the bases of transistors 58 and 60. As a result, current drawn to the collector of transistor 60 will also be a very small current, although possibly somewhat larger than that of the collector of transistor 58 because of the presence of resistor 59 providing some current gain, and this current will be drawn from the emitter of a further npn bipolar transistor, 61, having its collector serve as output 14 of $n^{th}$ input controller 13.

Current drawn by the collector of transistor 60 will be supplied through the base of transistor 61. This current is drawn through an npn bipolar transistor, 62, having its base and collector connected to positive voltage terminal 40 to be configured as a diode with its emitter connected to another npn bipolar transistor, 63, having its collector also connected to positive voltage terminal 40. The emitter of transistor 63 is connected to the base and emitter of a pnp bipolar transistor, 64, having its collector connected to the base of transistor 61 so that it is also configured as a diode. Thus, in these circumstances of a high impedance at terminal 12 of $n^{th}$ input of controller 13, an extremely small current will be at most drawn at output 14 thereof which, as will be seen, would be insufficient to permit it to operate output source energizer 16.

Similarly, the very small current drawn through transistor 56 will result in an equally small current being dawn through transistor 57 in these circumstances since it is in a mirror circuit arrangement with transistor 56. This small current is drawn through a further current mirror formed by a further two collector pnp bipolar transistor, 65, having its base connected to a collector thereof also connected to the collector of transistor 57. This assures that the current supplied at its second collector is also very small, and this current is supplied through a resistor, 66, to the base of a npn bipolar transistor, 67, and the collector of another bipolar transistor, 68.

The emitter of transistor 68 is connected through another resistor, 69, to ground reference terminal 41. The collector of transistor 67 is connected to positive voltage terminal 40, and its emitter is connected to the base of transistor 68, to a further resistor, 70, connected therefrom to ground reference terminal 41, and to the base of a further npn bipolar transistor, 71. The emitter of transistor 71 is also connected to ground reference terminal 41. The collector of transistor 71 serves as output 15 of $n^{th}$ input controller 13.

Resistor 66 serves as a current source with the positive voltage supply connected to terminal 40 supplying current to the current mirror formed by transistors 67, 68 and 71. Resistor 69 provides current gain so that the current at the collector of transistor 68 will be somewhat less than that at the collector of transistor 71, and resistor 70 helps to sink small currents to prevent them from causing transistor 71 to significantly conduct at such low currents. The small current, if any, flowing through resistor 66 from the collector of transistor 65 in these circumstances assures that only a very small current will flow at the collector of transistor 71 which, as will be seen, is too small to affect $n^{th}$ output sink energizer 17.

If, on the other hand, input terminal 12 of $n^{th}$ input controller 13 is at essentially the voltage on ground reference terminal 41 in a low logic state and placed there by a relatively low impedance source of such a logic signal, current flow through transistor 56 will be essentially that then permitted along the current path containing resistors 52 and 54, transistor 53 and resistor 44. Keeping the resistance of resistor 44 quite small assures that little or no current will flow in transistor 55 so that no current will be drawn at output 14. On the other hand, a significant current will flow through transistor 56 which will be reflected in the current flowing through transistor 57 and transistor 65. As a result, substantial current will flow at the other collector of transistor 65, and this will lead to substantial current being drawn at output 15 of the input controller to activate $n^{th}$ output sink energizer 17.

In the remaining situation of a high logic state present on input terminal 12 at a relatively lower impedance, input terminal 12 will essentially be at the voltage on terminal 40. If resistor 44 again is relatively small, little or no current will flow in transistor 56 and so a similar current will flow in transistor 57. As a result, there will be little or no current flowing at the second collector of transistor 65 and so very little current will be drawn at output 15 of $n^{th}$ input controller 13. On the other hand, a substantial current will flow through transistor 50 set by the voltage at the base of transistor 49, and will flow on the current path including resistors 52 and 54, and transistor 53. A corresponding substantial current will flow through transistor 51 and so through transistor 55 to be supplied primarily from terminal 12 through resistor 44. Thus, significant current will flow through the second collector of transistor 55 so that a substantial current is drawn at output terminal 14 of $n^{th}$ input controller 13.

The final npn bipolar transistor present, 72, serves as AND logic gate 28 but in modified form, and so is designated 28' in FIG. 2. The base of transistor 72 is connected through a resistor, 73, to a corresponding output of sense limit off condition timer 26. The emitter of transistor 72 is connected to the output of $n^{th}$ R-S flip-flop 24 but through an inverter which has not been shown, this omission leading to the designation 28' in FIG. 2. If the emitter of transistor 72 is grounded and the base of transistor 73 is raised toward the voltage present on terminal 40, transistor 72 will be switched strongly into the "on" condition and will effectively ground the base of transistor 53 so that no biasing current can be delivered to either the current mirror involving transistors 56 and 57, or the current mirror involving transistors 50 and 51. In these circumstances, there will be little or no current drawn at outputs 14 and 15 of $n^{th}$ input controller 13. In other circumstances, transistor 72 is in the "off" condition and the behavior of the circuit of FIG. 2 will be as described previously.

Figure 3:
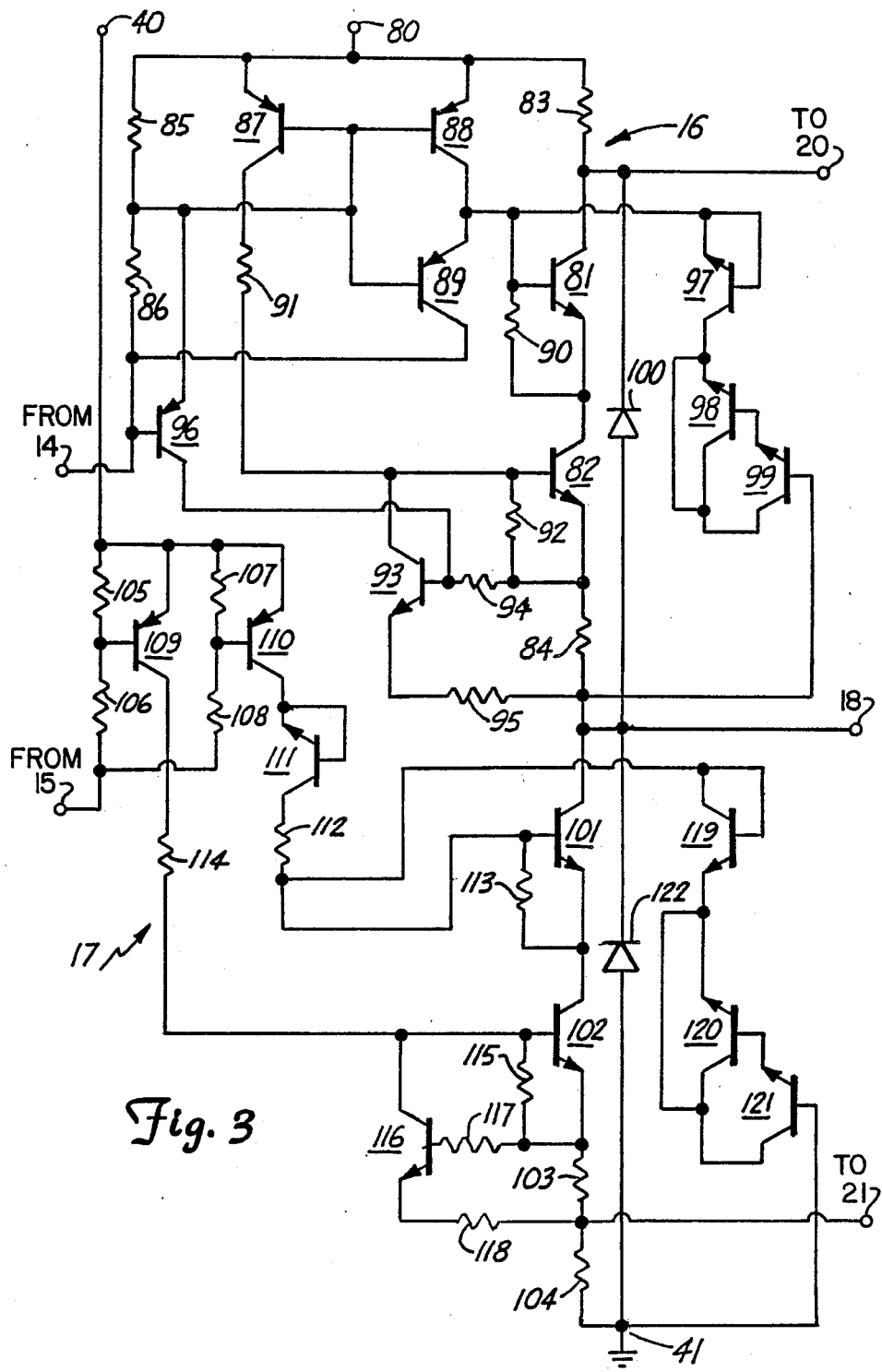
FIG. 3 is a circuit schematic diagram of another portion of FIG. 1.

FIG. 3 shows a schematic diagram of the circuit serving as $n^{th}$ output source energizer 16 and $n^{th}$ output sink energizer 17 of FIG. 1 together. Output source energizer 16 has a terminal, 80, which is to be connected to a voltage source capable of supplying the necessary power to the output load, and which typically has a voltage value of a few tens of volts. In the present example, the integrated circuit chip structure in which the power system controller is formed permits this source voltage to be anywhere from 5 V to 36 V. This voltage will be applied to a load connected to terminal 18 if the other side of that load is connected to ground reference terminal 41 except for the saturation voltages of the controlling npn bipolar transistors in series therewith and the voltage drops across a couple of small value resistors also in series therewith. Alternatively, the other side of such a load can be connected to terminal 80 and the positive voltage supplied to that terminal will be dropped across it in the opposite direction again excepting small control transistor saturation voltages and small drops across small value series resistors.

In the first situation with the other side of the load connected to ground reference terminal 41, two series primary load control npn bipolar transistors, 81 and 82, are connected together so the emitter of transistor 81 is connected to the collector of transistor 82, and these two series transistors are connected together in series between terminals 80 and 18. Two series transistors are used as primary load control transistors rather than a single transistor to provide a sufficient breakdown voltage if energizer 16 is directed to withstand the voltage provided at terminal 80 while in "on" condition (if the load is short-circuited) or the "off" condition. These primary load control transistors are in turn controlled, through the other circuitry present therebetween, from the terminal indicated in FIG. 3 to receive signals from output terminal 14 of $n^{th}$ input controller 13 of FIG. 1.

A small resistor, 83, is connected between the collector of transistor 81 and positive voltage terminal 80. This resistor is a very small resistor, typically 0.124Ω used in connection with the current sense arrangement. Another small protective circuit activation resistor, 84, is connected between the emitter of transistor 82 and controlled power output supply output terminal 18. Resistor 84 is typically on the order of 1.5Ω.

As indicated in connection with FIG. 2, the signal at terminal 14 is the presence or absence of a significant current being drawn there. If such a significant current is being drawn, a pair of voltage divider resistors, 85 and 86, connected in series between terminal 80 and input 14, will have a voltage appearing thereacross due to transistors 61 and 60 of FIG. 2 drawing a current. In these circumstances, resistor 86 will provide a current path to ground reference terminal 41 through transistors 61 and 60 of input controller output 14 for the bases of three pnp bipolar transistors, 87, 88 and 89 (and a further pnp transistor described below serving to increase this base current as described below).

The emitters of transistors 87 and 88 are connected to positive voltage terminal 80 and, thus, these two transistors will be switched strongly into the "on" condition. The collector of transistor 88 is connected to the base of transistor 81 and to the emitter thereof through a resistor, 90, to provide the current to force transistor 81 into the "on" condition. The saturation of transistor 81 is limited to an extent by the presence of transistor 89 having its emitter connected to the collector of transistor 88. Transistor 89 shunts some of the collector current of transistor 88 away from the base of transistor 96 as transistor 88 goes into saturation. This shunted current passes out of the collector of transistor 89 which is connected to terminal 14, reducing the current in transistor 96 but keeping transistor 88 saturated.

The current from transistor 87 in saturation passes from its collector through a current limiting resistor, 91, and to the base of transistor 82 as well as through a further resistor, 92, in shunt across the base-emitter junction of transistor 82. This current forces transistor 82 into saturation so that both transistors 81 and 82 are in saturation when significant current is drawn at terminal 14 so that nearly the entire positive voltage applied at terminal 80 can indeed be applied across a load connected between terminals 18 and 41. Resistors 85 and 86 have resistance values around 7 kΩ so that insignificant currents drawn at output 14 cannot switch "on" transistors 81 and 82.

A current limiting circuit is provided based on a further npn bipolar transistor, 93, having its collector connected to the base of transistor 82 and its base connected through a further resistor, 94, connected to the emitter of transistor 82. In addition, the emitter of transistor 93 is connected through another resistor, 95, to output terminal 18. This arrangement senses the voltage rise across resistor 84 due to current flowing therethrough and limits the current which is passed by transistor 82. This forms a back-up protective system in addition to the current sense arrangement described above for the system of FIG. 1 based on $n^{th}$ source current limit sensor 20 and its connections to input 19 of $n^{th}$ input controller 13.

A further pnp bipolar transistor, 96, mentioned above and having its emitter connected to the junction of resistors 85 and 86 and its base connected to the opposite side of resistor 86, increases the drive current drawn at the bases of transistors 87 and 88 and shunts it through the collector thereof to the base of transistor 93. Thus, additional current is drawn by transistor 96 from the bases of transistors 87 and 88 causing them to be further into saturation, and this current is supplied to the base of transistor 93 where it tends to cause it to shunt some of the current from the collector of transistor 87 away from the base of transistor 82 though this latter effect is not intended to be very significant.

Transistors 81 and 82 are protected against very large currents continuing to be drawn therethrough should one of them breakdown by avoiding such a breakdown. An npn bipolar transistor, 97, has its base and its collector connected to the base of transistor 81, and its emitter connected to the emitter and collector of npn bipolar transistor, 98. The base and collector of transistor 98 are connected to the emitter and collector, respectively, of a further npn bipolar transistor, 99. The base of transistor 99 is connected to output terminal 18. If a voltage which could lead to breakdown of transistors 81 and 82 is applied to terminal 80, the breakdown values of the base-collector junction of transistor 88 and the emitter-base junctions of transistors 98 and 99 will be such so they breakdown first thereby limiting any voltage rise across transistor 82 to a safe value.

In addition, a diode, 100, is provided having its anode connected to terminal 18 and its cathode connected to the collector of transistor 81. This diode also limits voltage excursions of output terminal 18 with respect to positive voltage terminal 80.

If no significant current flows from terminal 14, transistors 87 and 88 will be in the "off" condition so that no collector current therefrom is available to be drawn by the bases of series transistors 81 and 82. As a result, energizer 16 will appear to have a high impedance at terminal 18 since all connections to that terminal through energizer 18 go through a collector of a transistor at some place along the current path, or through a reverse biased semiconductor pn junction.

Energizer 17 operates in much the same manner as does energizer 16. Again, a pair of series-connected primary load control npn bipolar transistors, 101 and 102, are provided to give a sufficient breakdown capability with the collector of transistor 101 being connected to output terminal 18. The emitter of transistor 101 is connected to the collector of transistor 102. The emitter of transistor 102 is connected through a series arrangement of a 1.5Ω protective resistor, 103, and a 0.1Ω sensing resistor, 104, to ground reference terminal 41.

Currents to the bases of series transistors 101 and 102 flow when a current is drawn at output 15 of $n^{th}$ input controller 13. This occurs when transistor 71 in FIG. 2 is forced into the "on" condition so that output 15 is forced sufficiently toward the voltage value of ground reference terminal 41 to draw sufficient base current from the transistor bases connected thereto. In these circumstances, a pair of voltage divider resistors, 105 and 106, connected between terminal 15 and terminal 40, the terminal having positive regulated voltage applied thereacross just as in FIG. 2, have that regulated voltage appear thereacross. A similar situation exists for a further series pair of resistors, 107 and 108, provided in parallel therewith. Resistors 106 and 108 assure proper division of current. The junction of resistors 105 and 106 has the base of a npn bipolar transistor, 109, connected thereto, and the junction of resistors 107 and 108 has the base of another npn bipolar transistor, 110, connected thereto. The emitters of transistors 109 and 110 are connected to terminal 40. The collector of transistor 110 is connected to the emitter and base of a pnp bipolar transistor, 111, having its collector connected through a current limiting resistor, 112, to the base of transistor 101 and through a further resistor, 113, to the emitter of transistor 101. Thus, current from the collector of transistor 110 is provided to force transistor 101 into saturation.

Similarly, the collector of transistor 109 is connected through a current limiting resistor, 114, to the base of transistor 102 and through a further resistor, 115, to the emitter of transistor 102. Current from the collector of transistor 109 thus can force transistor 102 into saturation.

As above, a current limiting circuit is again provided here which is designed, again as a back-up, to provide such current limiting at a value greater than that sensed by $n^{th}$ sink current limit sensor 21 based on the voltage occurring across resistor 104. This current limiting circuit is based on a npn bipolar transistor, 116, having its collector connected to the base of transistor 102 and its base connected through a resistor, 117, to the emitter of transistor 102. The emitter of transistor 116 is connected through a further resistor, 118, to the junction of resistors 103 and 104. Again, a sufficient voltage drop occurring across resistor 103 causes transistor 116 to remove current from the base of transistor 102.

Also again, very large currents are prevented from continuing to be drawn through transistors 101 and 102 after a breakdown thereof by avoiding same. A npn bipolar transistor, 119, having its collector and base connected to the base of transistor 101. The emitter of transistor 119 is connected to the emitter and collector of a npn bipolar transistor, 120, which in turn has its base and collector connected to the emitter and collector, respectively, of a further npn bipolar transistor, 121. The base of transistor 121 is connected to ground reference terminal 41. Excursions of voltage on output terminal 18 are limited with respect to ground reference terminal 41 by the presence of a diode, 122, having its anode connected to ground reference terminal 41 and its cathode connected to output terminal 18.

In the absence of current being drawn at terminal 15, both transistors 109 and 110 are in the "off" condition. In these circumstances, energizer 17 appears to be a large impedance at terminal 18 since only transistor collectors are connected thereto or reverse bias semiconductor pn junctions.

Figure 4:
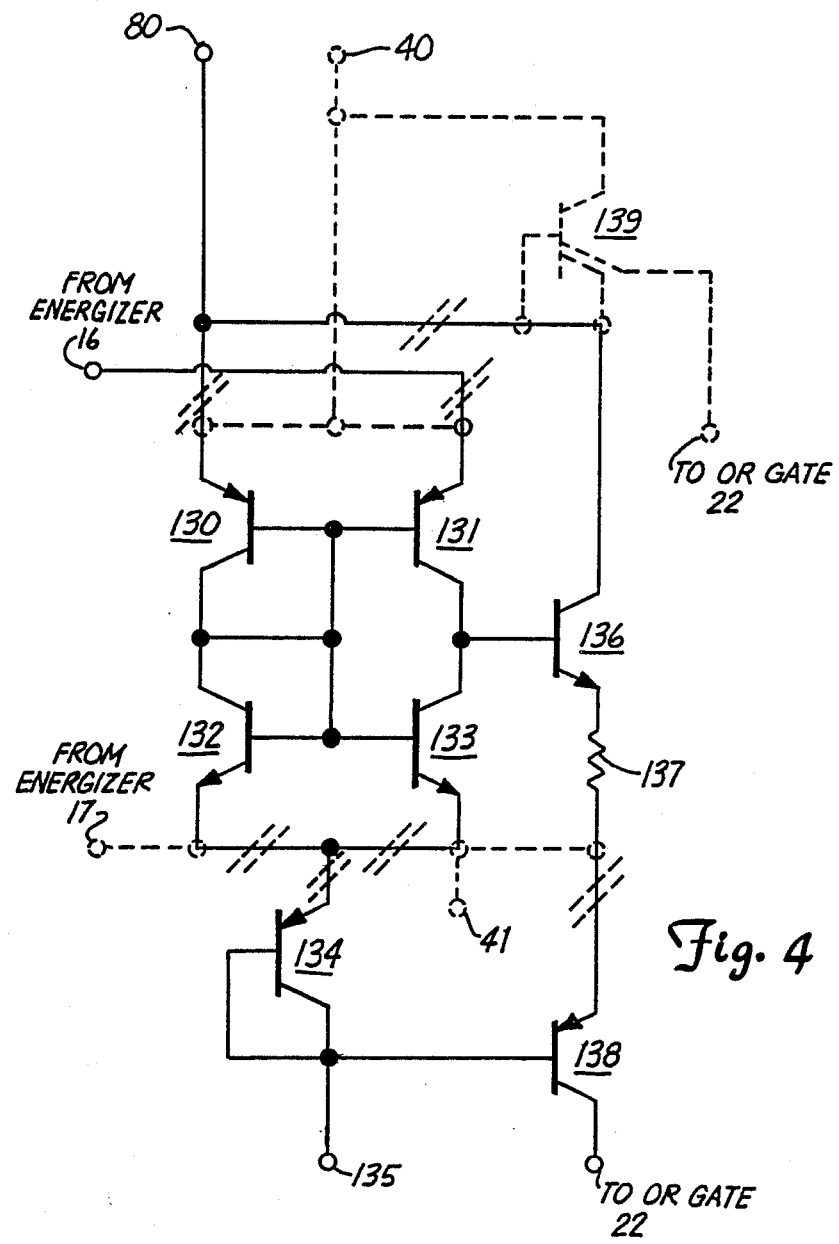
FIG. 4 is a circuit schematic diagram of another portion of FIG. 1.

FIG. 4 shows schematic diagrams of alternative versions of a current limit sensor, one version serving as $n^{th}$ source current limit sensor 20 and the other version serving as $n^{th}$ sink current limit sensor 21 of FIG. i. The solid line components represent the version of current limit sensor 20 to be first described, and all dashed lines can be ignored in this first part of the description of FIG. 4. The same designations used in previous figures are again used where appropriate in FIG. 4 for similar terminals.

The sensing system comprises primarily a matched pair of pnp bipolar transistors, 130 and 131, and a corresponding nearly matched pair of npn bipolar transistors, 132 and 133. Transistor 130 has its emitter connected to positive supply terminal 80 in FIG. 3, and transistor 131 has its emitter connected to the collector of transistor 81 in FIG. 3 so that sensing resistor 83 appears between this emitter and positive supply terminal 80. The bases of transistors 130 and 131 are directly connected together and to the collector of transistor 132, and further to the bases of transistors 132 and 133, also directly connected together. The collector of transistor 133 is connected to the collector of transistor 131. The emitters of transistors 132 and 133 are connected together and to the emitter of a further pnp bipolar transistor, 134, having its base and collector connected directly to one another and connected to a current sink terminal, 135.

A further npn bipolar transistor, 136, serves as the sensor output transistor and has its collector connected to terminal 80, and its base connected to the junction of the collectors of transistors 131 and 133. The emitter of transistor 136 is connected through a resistor, 137, to the emitter of another pnp bipolar transistor, 138. The base of transistor 138 is connected to terminal ;35, and the collector of transistor 138, providing the sensor circuit output, is connected to an inverter connected in turn to the input of OR logic gate 22 of FIG. 1.

Transistors 130 and 131 are closely matched pnp bipolar transistors. On the other hand, transistors 132 and 133 are closely matched except in emitter area where transistor 132 has twice the emitter area that transistor 133 has. As a result, for little or no current flowing through resistor 83 of FIG. 3, substantially identical currents will be drawn at the bases of transistors 130 and 131, and, therefore, substantially identical currents will flow from the collectors of transistors 130 and 131.

However, there will be different currents drawn at the collectors of transistors 132 and 133 because of the difference in emitter areas of these two transistors. The greater emitter area of transistor 132 means that for a given collector current drawn therethrough, a smaller voltage drop will occur across its base-to-emitter junction than across that of transistor 133. Since the bases of these two transistors are directly connected together as are their emitters, they are constrained to have the same base-to-voltage thereacross so that the difference in emitter areas requires a greater base and collector current to flow in transistor 132 than flows in transistor 133.

The current supplied to the base of transistor 132, operated as a forward biased diode, is just enough to cause that transistor to draw at its collector essentially the current supplied by the collector of transistor 130, also operated as a forward biased diode. Since, as indicated above, a smaller base current flows in transistor 133, the current drawn at the collector of transistor 133 will also be less than that supplied at the collector of transistor 131 which matches that being supplied at the collector of transistor 130. This difference in current must flow in the base of transistor 136 causing it to be in the "on" condition so that a collector current is drawn by transistor 136 from positive supply terminal 80. Since terminal 135 is constrained to be at a voltage three diode voltage drops below that at terminal 80, and since the base of transistor 138 is connected thereto, the current drawn at the collector of transistor 136 is constrained to a value determined by the value of resistor 137. This current is transmitted at the collector of transistor 138 to an inverter not shown which provides an inverted logic signal OR logic gate 22. Alternatively, a NOR logic gate could be used.

As current flows through resistor 83 in FIG. 3, the resulting voltage drop thereacross lowers the voltage occurring on the emitter of transistor 131. This reduced emitter voltage leads to a smaller emitter-to-base voltage across transistor 131 reducing the current at its collector. For sufficient current flowing through resistor 83, the voltage thereacross will reach a point where transistor 133 draws such an increased fraction of the current from the collector of transistor 131 that the current flowing through transistor 136 is sufficiently reduced so that the inverter not shown produces a high voltage value logic state at an input of OR logic gate 22. At this point, a beyond-limit current has been detected in energizer 16. The detection point is primarily set by the ratio of emitter areas of transistors 132 and 133.

The current sense limit circuit 21 operates in much the same fashion as did that for current limit sensor 20. FIG. 4 schematically diagrams this circuit also if the dashed line components are now considered, and the solid line components on the opposite sides of double dashed lines from transistors 130 through 133 are considered no longer being in the circuit. In these circumstances, the emitters of transistors 130 and 131 are connected to regulated positive voltage terminal 40 rater than to positive terminal 80. Also, the emitter of transistor 133 is connected to ground reference terminal 41, and the emitter of transistor 132 is connected to the junction of resistors 103 and 104 in FIG. 3 so that resistor 104 appears between the emitter of transistor 132 and ground reference terminal 41. In addition, a further two-collector pnp bipolar transistor, 139, is provided having its emitter connected to regulated positive voltage terminal 40, and its base and one of its collectors directly connected together and to the collector of transistor 136. The remaining collector of transistor 139 is provided through an inverter, not shown, to an input of OR logic gate 22, or alternatively, a NOR logic gate.

In this arrangement, transistors 130 and 131, being well matched, always have the same base current drawn from each and always provide the same current flowing out of the collector of each. Transistors 132 and 133 are again well matched except that transistor 132 again has an emitter area twice that of transistor 133. Thus, for no current flowing in resistor 104, a sufficient base current will flow in transistor 132 to draw all the collector current supplied by transistor 130 but the base current flowing in transistor 133 will not be sufficient to draw all of the collector current supplied by transistor 131. The difference, again, must flow into the base of transistor 136. This will cause transistor 136 to be in the "on" condition, drawing a collector current which will be determined in value by the size of resistor 137 limiting the amount of current which can flow from the emitter of transistor 136 to ground reference terminal 41. The resulting collector current of transistor 136 will be drawn from the collector of transistor 139 directly connected to the base thereof, and a similar current will be supplied at the remaining collector of transistor 139 to the inverter not shown connected to OR logic gate 22.

As increasing currents flow in energizer 17 through resistor 104, the voltage thereacross will rise. Such a rise in voltage in the emitter circuit of transistor 132 will raise the voltage between the base of transistor 132 and ground reference terminal 41 so as to shunt more current to the base of transistor 133. This increases the current drawn at the collector of transistor 133 and, at some point, a sufficient part of the current supplied at the collector of transistor 131 will be shunted away from the base of transistor 136 so that the current flowing in the collector of transistor 139 connected to the inverter not shown will lead to a change of logic state at the output thereof which is applied to OR logic gate 22. At that point, a beyond-limit current in energizer 17 has been detected. Again, the ratio of emitter areas of transistors 132 and 133 primarily determine the detection point.

Figure 5:
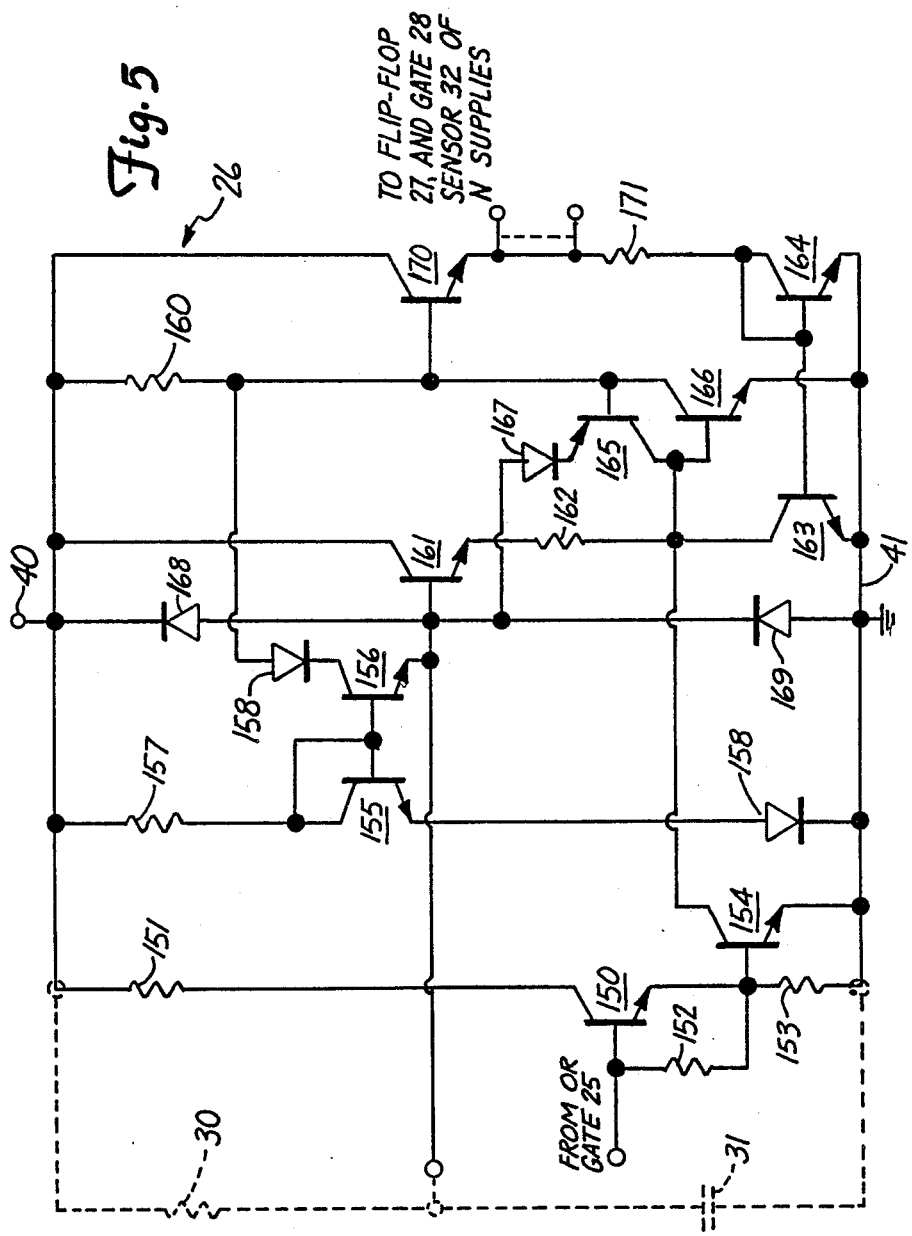
FIG. 5 is a circuit schematic diagram of another portion of FIG. 1.

FIG. 5 shows a schematic diagram of a circuit for sense limit off condition timer 26 of FIG. 1. Resistor 30 and capacitor 31 have been shown in dashed line form to the left of FIG. 5 indicating their connections in that circuit. Once again, the same terminal designations are used in FIG. 5 as were used in earlier Figures, including the intent to have regulated positive voltage provided at terminal 40 with respect to ground reference terminal 41.

If the output of OR logic gate 25 of FIG. 1 is in a low voltage value logic state, the terminal therefrom shown to the left in FIG. 5 is essentially at the voltage occurring on ground reference terminal 41. This terminal leads to the base of a npn bipolar transistor, 150, having a current limiting resistor, 151, connecting its collector to terminal 40. A biasing resistor, 152, is connected between the base of transistor 150 and its emitter. A signal output resistor, 153, for transistor 150 connects the emitter of transistor 150 to ground reference terminal 41 with the junction of that emitter and resistor 153 being connected to the base of a further npn bipolar transistor, 154.

Continuing to assume that the base of transistor 150 at the voltage of ground reference terminal 41, both of transistors 150 and 154 are in the "off" condition. In these circumstances, resistor 30 provides the current to keep a latch-up switch arrangement in the "on" condition. A current mirror arrangement, formed of a pair of npn bipolar transistors, 155 and 156, is connected across resistor 30 but is "off" in this situation and does not supply any current to that arrangement. The base and collector of transistor 155 are connected through a current limiting resistor, 157, to regulated positive voltage terminal 40. The emitter of transistor 155 is connected to the anode of a diode, 158, the cathode of which is connected to ground reference terminal 41. The base of transistor 155 is directly connected to the base of transistor 156. The collector of transistor 156 is connected through a further diode, 159, to a resistor, 160, the other end of which is connected to regulated positive voltage terminal 40. The emitter of transistor 156 is connected to the base of a further npn bipolar transistor, 161, having its collector connected to regulated power voltage terminal 40. The emitter of transistor 161 is connected to a current limiting resistor, 162, which in turn is connected to a portion of a further current mirror circuit based on a pair of npn transistors, 163 and 164, with resistor 162 being connected to the collector of transistor 163.

In addition, the junction of resistor 162 and the collector of transistor 163 are connected to the latch-up switching arrangement mentioned above formed by a pnp bipolar transistor, 165, and an npn bipolar transistor, 166. The latch-up arrangement in effect forms a silicon controlled switch having the base of transistor 165 connected to the collector of transistor 166 and vice versa. The emitter of transistor 166 is connected to ground reference terminal 4. The junction of the emitter of transistor 156 and the base of transistor 161 is connected through a further diode, 167, to the emitter of transistor 165. A pair of diodes, 168 and 169, are used to limit the voltage excursions of this junction of the emitter of transistor 156 and the base of transistor 161. Diode 168 has its anode connected to that junction and its cathode connected to positive voltage terminal 40, and diode 169 has its cathode connected to that junction and its anode connected to ground reference terminal 41.

The current source containing transistors 163 and 164 has the emitters of each connected together and to ground reference terminal 41. The bases are directly connected to one another with the base of transistor 164 also directly connected to its collector. A npn bipolar output transistor, 170, has its emitter connected through a current limiting output load resistor, 171, to the base and collector of transistor 164. The base of output transistor 170 is connected to the collector of transistor 166 and to the junction of resistor 160 and the anode of diode 159. The collector of output transistor 170 is connected to regulated positive voltage terminal 40.

The current to the base of transistor 161 from resistor 30 flows through resistor 162 to the base of transistor 166 of the latch-up switch arrangement causing that switch arrangement to be in the "on" condition with both transistors 165 and 166 driven well into saturation. Current supplied by resistor 30 to diode 167 allows this latch-up arrangement to be maintained in that condition. As a result, the base of output transistor 170 is very nearly at the voltage on ground reference terminal 41 so that the output of timer 26 is also approximately at the voltage on ground reference terminal 41. In addition, capacitor 31 is maintained at about a voltage equal to the drop across diode 167 and whatever voltage drop occurs between the emitters of transistors 165 and 166 in the latch-up arrangement so that capacitor 31 is nearly discharged. In addition, the low voltage at the collector of transistor 166 eliminates the possibility of any significant current passing through the collector of transistor 156 after the latch-up arrangement involving transistors 165 and 166 has switched into the "on" condition. Transistor 155 is in the "off" condition since the emitter of transistor 156 is only a diode drop and a saturation drop above ground. That is the status maintained in timer 26 during the continuation of a low voltage logic state at the base of transistor 150. A change in this condition placing the base of transistor 150 in the high voltage value logic state for even a transient duration (which will be the case since an exceeded current limit sensed by either of current limit sensors 20 or 21 will result in input controller 13 going to the high impedance state at its outputs 14 and 15 thereby eliminating the beyond-limit current) will change the condition of timer 26 at its output for a selected time duration. The high logic state at the base of transistor 150 switches that transistor into the "on" condition which in turn switches transistor 154 strongly into the "on" condition shunting the collector current from transistor 165 to ground and switching transistor 166 into the "off" condition. Once in that condition, the latch-up arrangement involving transistors 165 and 166 will remain in the "off" condition until initiated once again into the "on" condition.

However, this return of the latch-up arrangement to the "on" condition cannot happen immediately because capacitor 31 keeps the voltage at the junction of the emitter of transistor 156 and the base of transmitter 161 low initially until it is sufficiently charged by current flowing through resistor 30. Transistors 155 and 156 will also remain in the "off" condition. During this time, current flowing through resistor 160 will flow into the base of output transistor 170 so that it can draw collector current from regulated positive voltage terminal 40 to flow through resistor 171 and transistor 164 raising the voltage on the output at the emitter of transistor 170 to a high logic value state. This output value is maintained until the latch-up arrangement involving transistors 165 and 166 switches back into the "on" condition. The relatively high voltage which occurs at the base of transistor 170 in these circumstances keeps transistor 165 in the latch-up arrangement strongly in the "off" condition.

Since relatively little current will be initially flowing in transistor 161 with capacitor 31 discharged, the current in the base of transistors 164 and 163 will be considerably larger than that necessary to cause transistor 163 to sink the small current being supplied by the emitter of transistor 161. Thus, transistors 163 and 161 will be in saturation during the time capacitor 31 is charging until that capacitor reaches a sufficient voltage thereacross to cause transistor 161 to supply enough current to permit transistor 163 to come out of saturation. As the voltage rises sufficiently at the collector of transistor 163, a base current will begin to flow in the base of transistor 166 of the latch-up arrangement, eventually reaching a point sufficient to switch that arrangement back into the "on" condition. As before, the voltage at the output of the timer, the voltage on the emitter of transistor 170, will go back toward being close to that of ground reference terminal 41 and the timer will maintain that state until again the high voltage logic state occurs at the base of transistor 150.

In some situations, the user of the power controller system of FIG. 1 may wish to energize a load connected to output terminal 18 under the control of signals provided at input terminal 12 of input controller 13, but without the protective features provided by the current limit sensors 20 and 21, sense limit off condition timer 26, flip-flop 24 and associated logic gates. For instance, the system providing the control signals at input 12 may have more elaborate beyond-limit current controls for the load built into it, and the user would rather rely on these. In such a situation, placing the terminal at the junction of resistor 30 and capacitor 31 at a voltage essentially that on ground reference terminal 41 will prevent a high voltage value logic state from appearing on input 19 of input controller 13. This is effective in FIG. 5 to prevent the base of output transistor 170 from rising much above the voltage on ground reference terminal 41 through transistor 155 being switched "on" and transistor 156 being forced into saturation so that the base of transistor 170 stays within the voltage drop of diode 159 and the saturation voltage of transistor 156 of ground reference terminal 141. As a result, timer 26 will be unable to provide a high logic state to AND logic gate 28 of FIG. 1 which would otherwise cause input controller 13 to have its outputs go into the high impedance state.

Although the present invention has been described with reference to preferred embodiments, workers skilled in the art will recognize that changes may be made in form and detail without departing from the spirit and scope of the invention.

What is claimed is:

1. A protective multiple output power controller for supplying ranges of currents within selected limits at those of a plurality of outputs thereof to which corresponding loads are electrically connected to result in selected voltages occurring thereacross, said power controller comprising:

a plurality of input controllers each having a first output region and each having a control input region and a cessation input region, said plurality of input controllers each being capable of having its said first output region in a first state for a first control state occurring at its said control input region and a first cessation signal value on its said cessation input region, and having its said first output region in a second state for a second control state occurring at its said control input region with said first cessation signal value on its said cessation input region, and of having its said first output region in said second state if a second cessation signal value occurs on its said cessation input region;

a first plurality of output energization means each having first and second current pass regions and having a control region therein by which it is capable of being directed, through electrical energization thereof, to effectively provide a conductive path between its said first and second current pass regions, said control region of each of said first plurality of output energization means being electrically connected to a said first output region of a corresponding one of said plurality of input controllers, said first and second current pass regions of each of said first plurality of output energization means having a selected one thereof serving as one of said power controller outputs and with that one thereof remaining being electrically connected to a first terminal means adapted for electrical connection to a first supply of electrical energization;

a first plurality of current sensing means each having an output region and each being capable of sensing currents flowing through at least one of said first and second current pass regions of a corresponding one of said first plurality of output energization means, and of providing a selected logic state on said output region thereof if a current being sensed thereby is beyond a selected threshold value;

a plurality of resettable memory means each having an output region and both a setting input region and a resetting input region such that one logic state occurs on its said output region if a selected logic state occurs on its said setting input region but that an opposite logic state occurs on its said output region if a selected logic state occurs on its said resetting input region, said setting input region of each of said plurality of memory means being electrically connected to a said output region of a corresponding one of said first plurality of sensing means;

a power removal timer means having an initiation input region and an output region, said power removal timer means being capable of having a selected signal occur on its said output region at a selected time duration after a selected signal occurs on said power removal timer means initiation input region, said power removal timer means output region being electrically connected to said resetting input region of each of said plurality of resettable memory means;

a first coupling means having an output region and a plurality of input regions, said first coupling means being capable of having a selected signal occur on its output region after a selected signal occurs on any one of its said plurality of input regions, said first coupling means output region being electrically connected to said power removal timer means initiation input region and said first coupling means plurality of input regions each being electrically connected to a said output region of a corresponding one of said first plurality of sensing means; and a plurality of second coupling means each having an output region and a pair of input regions, said plurality of said coupling means each being capable of having a signal occur on its said output region after selected signals occur concurrently on both of its said, pair of input regions, said plurality of second coupling means each having its output region electrically connected to a said cessation input region of a corresponding one of said plurality of input controllers, said plurality of second coupling means each having one of its said pair of input regions electrically connected to a said output region of a corresponding one of said plurality of resettable memory means and having that input region thereof remaining electrically connected to said output region of said power removal timer means.

2. The apparatus of claim 1 wherein each of said plurality of input controllers has also a second output region, said plurality of input controllers each also being capable of having its said second output region in a first state for a third control state occurring at its said control input region with said first cessation signal value on its said cessation input region, and having its said second output region in a second state for said second control state occurring at its said control input region with said first cessation signal on its said cessation input region, and of having its said second output region in said second state if said second cessation signal value occurs on its said cessation input region; and wherein said apparatus further comprises a second plurality of output energization means each having first and second current pass regions and having a control region therein by which it is capable of being directed, through electrical energization thereof, to effectively provide a conductive path between its said first and second current pass regions, said control region of each of said second plurality of output energization means being electrically connected to a said second output region of a corresponding one of said plurality of input controllers, said first and second current pass regions of each of said second plurality of output energization means having a selected one thereof electrically connected to that one of said power source outputs which is formed by a said output region of that one of said first plurality output energization means electrically connected to a common one of said input controllers, and with that said current pass region thereof remaining being electrically connected to a second terminal means adapted for electrical connection to a second supply of electrical energization.

3. The apparatus of claim wherein there is further provided a plurality of delay timer means each having an input region and an output region, said plurality of delay timer means each being capable of having a signal occur on its said output region at a selected time duration after a selected signal occurs on its input region, said plurality of delay timer means each having its input region electrically connected to said output region of a corresponding one of said first plurality of current sensing means, said setting input region of each of said plurality of memory means being electrically connected to said output region of a corresponding one of said first plurality of current sensing means, as aforesaid, by being electrically connected to said output region of that said delay timer means electrically connected to that said current sensing means output region, and said input region of said first coupling means being electrically connected to said output region of a corresponding one of said first plurality of current sensing means, as aforesaid, by being electrically connected to said output region of that said delay timer means electrically connected to that said current sensing means output region.

4. The apparatus of claim 1 further comprising a temperature sensing means having a first output region, said temperature sensing means being capable of sensing selected temperatures occurring in that structural arrangement in which said power controller is implemented and of providing an output signal at its said first output region if such temperatures exceed a corresponding selected threshold, said temperature sensing means first output region being electrically connected in said power controller so that said temperature sensing means, in supplying an output signal if a temperature sensed thereby goes beyond a said threshold, is capable of causing all of said plurality of input controllers to have said output regions thereof in said second state.

5. The apparatus of claim 1 wherein said first coupling means comprises a logic gate which performs the OR logic function.

6. The apparatus of claim wherein said plurality of second coupling means each comprises a logic gate which performs the AND logic function.

7. The apparatus of claim wherein said plurality of resettable memory means each comprises a R-S flip-flop.

8. The apparatus of claim 1 wherein said first plurality of output energization means each comprises a transistor-based circuit means so that one of said first and second current pass regions thereof serving as a said power controller output, if that said first output region of a said input controller to which that said output energization means is electrically connected as aforesaid is in said second state, represents an impedance sufficiently great to prevent any significant electrical current flow through a load connected between such a said power controller output and a point having a voltage occurring thereon less in absolute value than that appearing on said first terminal means.

9. The apparatus of claim 1 wherein said power removal timer has a further external control input region, said power removal timer being capable of having said selected signal prevented from occurring on its said output region if a selected signal is provided on its said external control input region despite any signals occurring on its said initiation input region.

10. The apparatus of claim 2 wherein there is further provided a second plurality of current sensing means each having an output region and each capable of sensing currents flowing through at least one of said first and second pass regions of a corresponding one of said second plurality of output energization means, and of providing a selected logic state on said output region thereof if a current being sensed thereby is beyond a selected threshold value; and wherein there is further provided a plurality of third coupling means each having an output region and a plurality of input regions, said plurality of third coupling means each being capable of having a selected signal occur on its output region after a selected signal occurs on any one of its said plurality of input regions, said plurality of third coupling means each having one input thereof electrically connected to a corresponding one of said first plurality of current sensing means output regions and another input thereof electrically connected to said output region of that one of said second plurality of current sensing means electrically connected in common to a said input controller with that one of said first plurality of current sensing means so connected, said setting input region of each of said plurality of memory means being electrically connected to a corresponding one of said first plurality of sensing means output regions, as aforesaid, by being electrically connected to said output region of that said third coupling means electrically connected to that said current sensing means output region, and said input region of said first coupling means being electrically connected to said output region of a corresponding one of said first plurality of current sensing means, as aforesaid, by being electrically connected to said output region of that said third coupling means electrically connected to that said current sensing means output region.

11. The apparatus of claim 4 wherein said power removal timer means has a further temperature control input region, said power removal timer means being capable of having selected signals prevented from occurring on its said output region if a selected signal is provided on its said temperature control region despite any signals occurring on its said initiation input region and despite any signals occurring on its said external control input region, said temperature sensing means first output region being electrically connected to said power removal timer means temperature control input region.

12. The apparatus of claim 8 wherein said transistor-based circuit means is based on bipolar transistors and said first plurality of output energization means have any circuit paths which extend between said first terminal means through a bipolar transistor base region and emitter region to said power controller output also extend through a collector region of a further bipolar transistor.

13. The apparatus of claim 10 wherein there is further provided a plurality of delay timer means each having an input region and an output region, said plurality of delay timer means each being capable of having a selected signal occur on its said output region at a selected time duration after a selected signal occurs on its input region, said plurality of delay timer means each having its input region electrically connected to said output region of a corresponding one of said plurality of third coupling means, said setting input region of each of said plurality of memory means being electrically connected to said output region of a corresponding one of said plurality of third coupling means, as aforesaid, by being electrically connected to said output region of that said delay timer means electrically connected to that said third coupling means output region, and said input region of said first coupling means being electrically connected to said output region of a corresponding one of said plurality of third coupling means, as aforesaid, by being electrically connected to said output region of that said delay timer means electrically connected to that said third coupling means.

14. The apparatus of claim 10 further comprising a temperature sensing means having a first output region and a second output region, said temperature sensing means being capable of sensing selected temperatures occurring in that structural arrangement in which said power controller is implemented and of providing an output signal at its said first and second output regions if such temperatures exceed a corresponding selected threshold, said temperature sensing means first and second output regions being electrically connected in said power controller so that said temperature sensing means, in supplying an output signal if a temperature sensed thereby goes beyond a said threshold, is capable of causing all of said plurality of input controllers to have said output regions thereof in said second state and of providing an indication of this condition.

15. The apparatus of claim 10 wherein said first coupling means comprises a logic gate which performs the OR logic function.

16. The apparatus of claim 10 wherein said plurality of second coupling means each comprises a logic gate which performs the AND logic function.

17. The apparatus of claim 10 wherein said plurality of third coupling means each comprises a logic gate which performs the OR logic function.

18. The apparatus of claim 10 wherein said plurality of resettable memory means each comprises a R-S flip-flop.

19. The apparatus of claim 10 wherein said first plurality of output energization means each comprises a transistor-based circuit means so that one of said first and second current pass regions thereof serving as a said power controller output, if that said first output region of a said input controller to which that said output energization means is electrically connected as aforesaid is in said second state, represents an impedance sufficiently great to prevent any significant electrical current flow through a load connected between such a said power controller output and a point having a voltage occurring thereon less in absolute value than that appearing on said first terminal means.

20. The apparatus of claim 10 wherein said power removal timer has a further external control input region, said power removal timer being capable of having said selected signal prevented from occurring on its said output region if a selected signal is provided on its said external control input region despite any signals occurring on its said initiation input region.

21. The apparatus of claim 14 wherein said power removal timer means has a further temperature control input region, said power removal timer means being capable of having selected signals prevented from occurring on its said output region if a selected signal is provided on its said temperature control region despite any signals occurring on its said initiation input region and despite any signals occurring on its said external control input region, said temperature sensing means first output region being electrically connected to said power removal timer means temperature control input region.

22. The apparatus of claim 18 wherein said transistor-based circuit means is based on bipolar transistors and said first plurality of output energization means have any circuit paths which extend between said first terminal means through a bipolar transistor base region and emitter region to said power controller output also extend through a collector region of a further bipolar transistor.

23. The apparatus of claim 21 wherein an input of each of said plurality of third coupling means is electrically connected to said temperature sensing means second output region.

24. A voltage limit indicator for providing an output signal at an output thereof if a monitored voltage provided at a selected input thereof goes beyond a selected limit, said voltage limit indicator comprising:

a pair of initial bipolar transistors substantially matched to one another, including first and second initial bipolar transistors, said pair of initial bipolar transistors having base regions of each directly electrically connected together and having emitter regions of each electrically connected to a first terminal means adapted for electrical connection to a first source of electrical energization, said first initial bipolar transistor having its base region electrically connected to its collector region;

a pair of complementary bipolar transistors each of which is of a type complementary to that of said first and second initial bipolar transistors, including first and second complementary bipolar transistors, said first complementary bipolar transistor being substantially matched to said second complementary bipolar transistor except for said second complementary bipolar transistor having an emitter area which is a selected fraction of that of said first complementary bipolar transistor, said pair of complementary bipolar transistors having base regions of each directly electrically connected together and each emitter regions of each electrically connected to a second terminal means adapted for electrical connection to a second source of electrical energization, said first complementary bipolar transistor having its base region electrically connected to its collector region, said first initial and first complementary bipolar transistors having collector regions of each electrically connected to one another, there being a selected one as said first complementary bipolar transistor and said second initial bipolar transistor emitter regions electrically connected to its corresponding one of said first and second terminal means through a source of said monitored voltage; and an output bipolar transistor having its base region electrically connected to each of said second initial and second complementary bipolar transistor base regions, and having its emitter and base regions electrically connected to said first and second terminal means, respectively.

25. The apparatus of claim 24 wherein said voltage monitor source is electrically connected between said first terminal means and said second initial bipolar transistor emitter region, and which further comprises a diode means electrically connected between said second terminal means and said first and second complementary bipolar transistor emitter regions with its anode connected to such emitter regions, and which further yet comprises a reference bipolar transistor having its base region connected to a cathode region of said diode means, and having its emitter and collector regions electrically connected between said output bipolar transistor emitter region and said second terminal means with its emitter region connected through a load means to said output bipolar transistor emitter region.

26. The apparatus of claim 24 wherein said monitored voltage source is electrically connected between said first complementary bipolar transistor emitter region and said second terminal means, and said output bipolar transistor emitter region is electrically connected through a load means to said second terminal means.

* * * * *

UNITED STATES PATENT AND TRADEMARK OFFICE
CERTIFICATE OF CORRECTION

PATENT NO. : 4,896,254

DATED : January 23, 1990

INVENTOR(S) : Robert M. Bennett et al.

It is certified that error appears in the above-identified patent and that said Letters Patent is hereby corrected as shown below:

Column 20, line 47, delete "claim," and insert --claim 1--.

Column 21, line 20, delete "claim," and insert --claim 1--.

Column 21, line 23, delete "claim," and insert --claim 1--.

Signed and Sealed this

Eleventh Day of December, 1990

Attest:

HARRY F. MANBECK, JR.

*Attesting Officer*     *Commissioner of Patents and Trademarks*